(12) United States Patent
Chen et al.

(10) Patent No.: US 11,837,543 B2
(45) Date of Patent: *Dec. 5, 2023

(54) FRONTSIDE-TO-BACKSIDE INTERMIXING ARCHITECTURE FOR COUPLING A FRONTSIDE NETWORK TO A BACKSIDE NETWORK

(71) Applicant: Arm Limited, Cambridge (GB)

(72) Inventors: Andy Wangkun Chen, Austin, TX (US); Sriram Thyagarajan, Austin, TX (US); Yew Keong Chong, Austin, TX (US); Sony, Noida (IN); Ettore Amirante, Nice (FR); Ayush Kulshrestha, New Delhi (IN)

(73) Assignee: Arm Limited, Cambridge (GB)

( * ) Notice: Subject to any disclaimer, the term of this patent is extended or adjusted under 35 U.S.C. 154(b) by 299 days.

This patent is subject to a terminal disclaimer.

(21) Appl. No.: 17/006,695

(22) Filed: Aug. 28, 2020

(65) Prior Publication Data

US 2022/0068813 A1 Mar. 3, 2022

(51) Int. Cl.
*H01L 23/528* (2006.01)
*H01L 27/06* (2006.01)

(52) U.S. Cl.
CPC ...... *H01L 23/5286* (2013.01); *H01L 27/0688* (2013.01)

(58) Field of Classification Search
CPC ............ H01L 23/5286; H01L 27/0688; H01L 23/535; H01L 21/76816; H01L 23/50; H01L 25/16; H03K 19/018507
USPC ....................................................... 257/207
See application file for complete search history.

(56) References Cited

U.S. PATENT DOCUMENTS

| | | | |
|---|---|---|---|
| 2017/0154655 A1* | 6/2017 | Seo | G11C 7/10 |
| 2020/0042668 A1* | 2/2020 | Peng | H01L 23/535 |
| 2020/0105671 A1* | 4/2020 | Lai | G06F 30/39 |
| 2021/0118798 A1* | 4/2021 | Liebmann | H01L 21/76877 |

* cited by examiner

*Primary Examiner* — Duy T Nguyen
(74) *Attorney, Agent, or Firm* — Pramudji Law Group PLLC; Ari Pramudji

(57) ABSTRACT

Various implementations described herein are related to various devices having a frontside power network with frontside supply rails and a backside power network with backside supply rails. The device may include intermixing architecture with transition vias that couple the frontside power network to the backside power network. The intermixing architecture may transition the frontside supply rails of the frontside power network to the backside supply rails of the backside power network.

15 Claims, 3 Drawing Sheets

FRONTSIDE-TO-BACKSIDE INTERMIXING ARCHITECTURE FOR COUPLING A FRONTSIDE NETWORK TO A BACKSIDE NETWORK

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
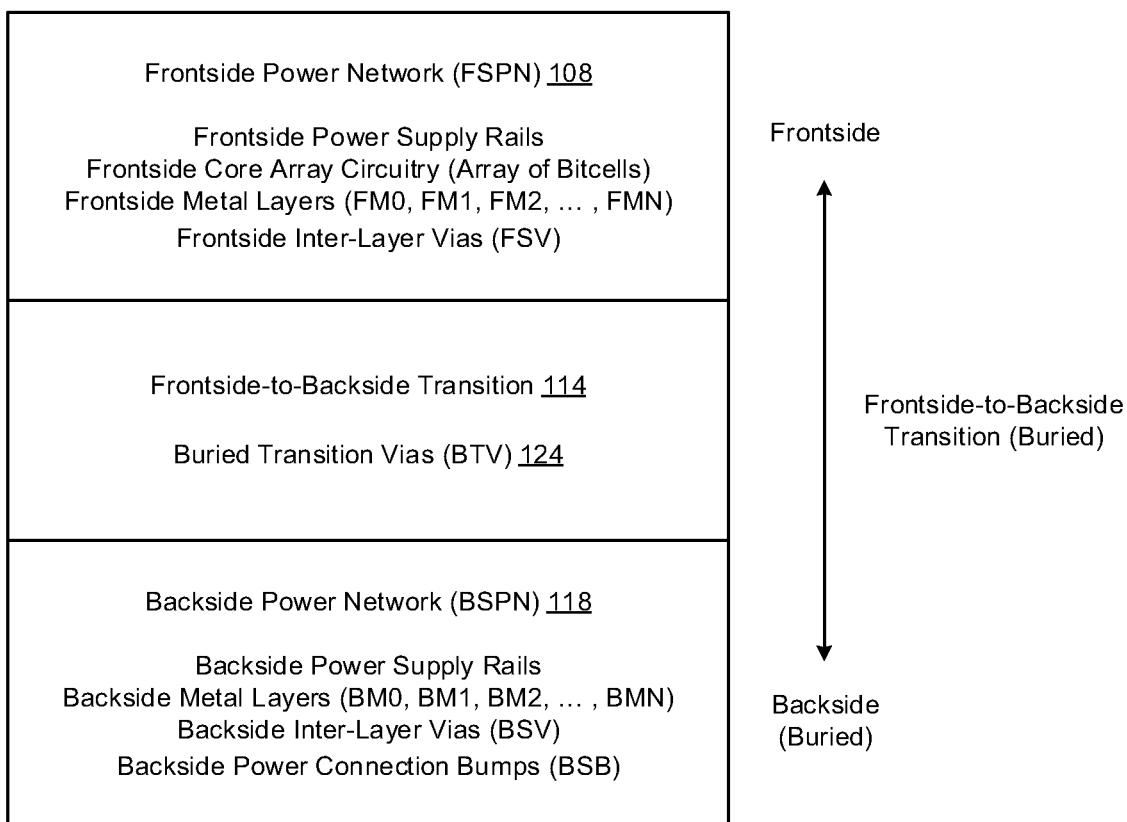
FIG. 1 illustrates a schematic diagram of buried power rail (BPR) architecture in accordance with various implementations described herein.

Various implementations described herein are directed to frontside-to-backside intermixing architecture that transitions power delivery between a frontside power network and a backside power network in various memory applications. For instance, the various schemes and techniques described herein may provide for a power delivery architecture that operates to provide a backside power delivery network for memory applications. The various schemes and techniques described herein may also provide for a memory power domain architecture for intermixing backside-to-frontside with buried power rails. As such, the memory power domain architecture may be configured to use backside buried metal for backside supply rails and use frontside metal for core-array supply rails.

In various implementations, the frontside-to-backside transition schemes and techniques described herein may provide for transitioning of frontside bitcells to backside periphery for buried rail memory, such as, e.g., random access memory (RAM) including static RAM (SRAM). For instance, in reference to the backside power domains for SRAM technology, metallization is provided frontside (e.g., above a device) and backside (e.g., below device) as buried power rails. In the logic domain, the buried power rails may be used in the core array such that power domains are used to avoid area penalty. Various implementations described herein may also provide for an overall power domain scheme for memory applications, including, e.g., frontside-to-backside transition cells.

In various implementations, the frontside-to-backside transition schemes and techniques described herein may provide for a device having a frontside power network and a backside power network. The device may include buried transition vias that may be configured to provide frontside-to-backside intermixing architecture by transitionally coupling the frontside power network to the backside power network. The frontside power network may have frontside supply rails, the backside power network may have backside supply rails, and also, the frontside-to-backside intermixing architecture transitions the frontside supply rails of the frontside power network to the backside supply rails of the backside power network so as to provide one or more power taps to the frontside power network from the backside power network.

In various implementations, the schemes and techniques described herein may provide for backside power domain in memory applications, such as, e.g., static random access memory (SRAM). The schemes and techniques described herein utilize memory metallization with frontside rails (e.g., above a device) and backside rails (e.g., below a device) as buried power rails. In some logic domains, buried power rails may be used, whereas in core arrays, core level power domains may be used to avoid area penalty. As such, various schemes and techniques described herein may provide for a power delivery network in memory applications, e.g., using backside-to-frontside transition cells. These aspects and various other features are described in greater detail herein.

Various implementations of frontside-to-backside intermixing architecture and techniques will be described in detail herein with reference to FIGS. 1-3.

FIG. 1 illustrates a diagram 100 of buried power rail (BPR) architecture 104 in accordance with various implementations described herein.

In various implementations, the BPR architecture 104 may be implemented as a system or a device having various integrated circuit (IC) components that are arranged and coupled together as an assemblage or combination of parts that provide for a physical circuit design and related structures. In some instances, a method of designing, providing and building the BPR architecture 104 as an integrated system or device may involve use of various IC circuit components described herein to thereby implement various frontside-to-backside intermixing techniques associated therewith. The BPR architecture 104 may be integrated with computing circuitry and related components on a single chip, and the BPR architecture 104 may be implemented in various embedded systems for automotive, electronic, mobile, server and Internet-of-things (IoT) applications.

As shown in FIG. 1, the BPR architecture 104 may include a frontside power network (FSPN) 108 with core array circuitry, such as, e.g., an array of bitcells. In some implementations, the frontside power network (FSPN) 108 may include frontside metal layers that supply a core voltage in one or more voltage domains, and the one or more voltage domains of the core voltage may refer an internal core voltage domain (VDDC). In other instances, the one or more core voltage domains may refer to an internal core voltage domain (VDDCE).

In some implementations, the frontside power network (FSPN) 108 may include various types of components, circuitry, and metals layers. For instance, the frontside power network (FSPN) 108 may have the frontside power network with frontside supply rails that are coupled to core array circuitry having an array of bitcells arranged in columns and rows. Also, the frontside power network (FSPN) 108 may include frontside metal layers (e.g., FM0, FM1, FM2, . . . , FMN) along with frontside inter-layer vias (FSV).

The BPR architecture 104 may include a backside power network (BSPN) 118 that provides a power delivery network for various frontside circuits, such as, e.g., column multiplexer circuitry (COLMUX), sense amplifier circuitry (SA), powergate input/output (PG I/O) circuitry, and powergate control (PG_CNTL). The backside power network (BSPN) 118 may be configured to provide one or more backside power domains for the multiple bitcells in the frontside power network (FSPN) 108. The power delivery network may be configured to supply periphery voltages and/or ground. In some implementations, the backside power network (BSPN) 118 may include one or more buried metal layers that supply a periphery voltage in multiple domains, and also, the multiple domains of the periphery voltage refer to an internal periphery voltage domain (VDDP) and an external periphery voltage domain (VDDPE). In other implementations, the multiple domains of the periphery voltage may refer to an internal core voltage domain (VDDCE). Also, in various instances, a ground supply may refer to an external ground (VSSE).

In various implementations, the backside power network (BSPN) 118 may include backside metals layers. For instance, the backside power network (BSPN) 118 may include a backside power network with backside supply rails. Also, the backside power network (BSPN) 118 may have backside metal layers (e.g., BM0, BM1, BM2, . . . , BMN) along with backside inter-layer vias (BSV). The backside power network (BSPN) 118 may include backside power connection bumps (BSB).

The BPR architecture 104 may include a frontside-to-backside transition 114 having vias that provide frontside-to-backside intermixing architecture by coupling the frontside power network to the backside power network. The vias refer to buried transition vias 124 that are configured to provide a transition between the frontside core array of the frontside circuitry 108 to the power delivery network of the backside power network (BSPN) 118. In some implementations, the frontside-to-backside intermixing architecture may be configured to transition the frontside supply rails of the frontside power network to the backside supply rails of the backside power network so as to thereby provide one or more power taps to the core circuitry from the backside power network. Also, the transition architecture 114 may be referred to as buried transition architecture that may have backside-to-frontside transition cells with the buried transition vias 124 that provide a coupling transition between the frontside power network (FSPN) 108 and the backside power network (BSPN) 118.

In some implementations, the frontside-to-backside intermixing architecture is configured to operate as memory power domain architecture that uses backside buried metal of the backside power network for the backside supply rails and also uses frontside metal of the frontside power network for the frontside supply rails. The core circuitry refers to frontside power network (FSPN) having the frontside metal, and the periphery circuitry refers to backside power network (BSPN) having the backside buried metal disposed underneath the frontside metal of the frontside power network (FSPN). Also, the transition architecture refers to buried transition architecture disposed between the backside buried metal of the backside power network (BSPN) and the frontside metal of the frontside power network (FSPN).

In some implementations, the buried transition architecture may be configured to use backside-to-frontside transition cells with the transition vias that couple frontside metal of the frontside power network to the backside buried metal of the backside power network. The frontside power network may include one or more frontside metal layers that supply a core voltage in one or more domains, such as, e.g., an internal core voltage domain (VDDC). Also, the backside power network may include one or more buried metal layers that may supply a periphery voltage in multiple domains, such as, e.g., an internal periphery voltage domain (VDDP) and an external periphery voltage domain (VDDPE). In various implementations, the core voltage domain or the periphery voltage domain may include and utilize an external core voltage domain (VDDCE).

In various implementations, the schemes and techniques described herein may provide for a memory power domain architecture for intermixing backside-to-frontside with buried power rails. As described herein, the memory power domain architecture may be configured to use backside buried metal for backside supply rails and use frontside metal for core-array supply rails. Also, the memory power domain architecture may use header-based power-gating circuitry in multiple different voltage domains, such as, e.g., VDDC, VDDCE, VDDP, VDDPE, along with a single ground, such as, e.g., VSSE. These aspects and various other features are described herein in reference to FIG. 2.

Figure 2:
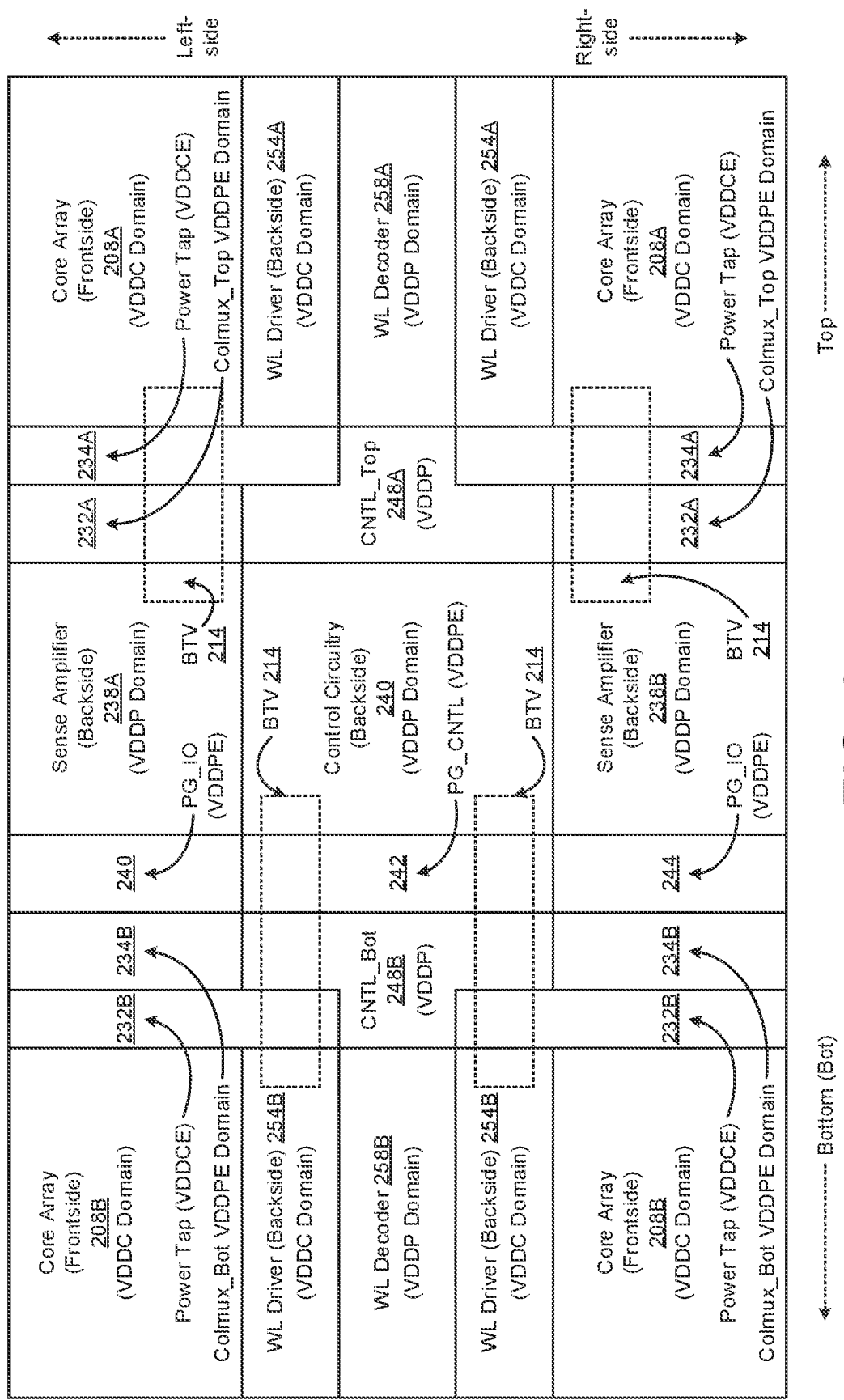
FIG. 2 illustrates a diagram of memory power domain (MPD) architecture in accordance with various implementations described herein.

FIG. 2 illustrates a diagram 200 of memory power domain (MPD) architecture 204 in accordance with various implementations described herein.

In various implementations, the MPD architecture 204 may be implemented as a system or a device having various integrated circuit (IC) components that are arranged and coupled together as an assemblage or combination of parts that provide for a physical circuit design and related structures. In some instances, a method of designing, providing and building the MPD architecture 204 as an integrated system or device may involve use of various IC circuit components described herein to thereby implement various frontside-to-backside intermixing techniques associated therewith. The MPD architecture 204 may be integrated with computing circuitry and related components on a single chip, and the MPD architecture 204 may be implemented in various embedded systems for automotive, electronic, mobile, server and Internet-of-things (IoT) applications.

As shown in FIG. 2, the memory power domain architecture 204 may include power delivery architecture having a frontside power network with frontside supply rails and a backside power network with backside supply rails. The power delivery architecture may include frontside-to-backside intermixing circuitry having vias that provide a coupling transition from the backside supply rails of the backside power network to the frontside supply rails of the frontside power network. In some implementations, the vias may refer to buried transitions vias (BTV) 214 that are configured to provide the coupling transition between the backside power network and the frontside power network.

The frontside power network (FSPN) of the memory power domain architecture 204 may have various types of components, circuits, and metal layers that are coupled to the core voltage domain (VDDC). For instance, the frontside power network (FSPN) may include top and bottom (bot) core arrays 208A, 208B on the right-side and the left-side that operate in the internal core voltage domain (VDDC). The frontside power network (FSPN) may include various other memory related circuits on the right-side and the left-side that operate in the internal core voltage domain (VDDC). In some instances, the term top may be referred to as upper, and also, the term bottom (bot) may be referred to as lower, wherein a top (or upper) layer may be disposed above a bottom (or lower) layer, which may be relative their respective position in a multi-layered memory stack in various memory applications.

The backside power network (BSPN) of the memory power domain architecture 204 may have various metal layers that are coupled to the one or more periphery voltage domains (VDDP, VDDPE, VDDCE). For instance, the backside power network (BSPN) may include top and bottom (bot) wordline decoders 258A, 258B and top and bottom (bot) controllers (CNTL_Top 248A, CNTL_Bot 248B) that may be configured to operate in the internal periphery voltage domain (VDDP). The backside power network (BSPN) may also include other backside control circuitry 240 that may operate in the internal periphery voltage domain (VDDP). The backside power network (BSPN) may include top and bottom (bot) wordline drivers (WLD) 254A, 254B on the right-side and the left-side that operate in the internal core voltage domain (VDDC). Also, the backside power network (BSPN) may include left-side and right-side sense amplifiers 238A, 238B that operate in the internal periphery voltage domain (VDDP).

The backside power network (BSPN) may include top and bottom (bot) column multiplexers (Colmux_Top 234A, Colmux_Bot 234B) on the right-side and left-side that may be configured to operate in the external periphery voltage domain (VDDPE). Also, in some instances, the backside power network (BSPN) may include left-side powergate I/O 240, powergate controller 242, and right-side powergate I/O 244 that may also be configured to operate in the external periphery voltage domain (VDDPE).

The frontside-to-backside intermixing circuitry may be referred to as transition architecture having buried transition vias (BTV) 214 in top and bottom (bot) power taps 232A, 232B on the right-side and the left-side that operate in the external core voltage domain (VDDCE). In some instances, the frontside-to-backside intermixing architecture may be configured to provide the BTVs 214 as coupling transitions (and/or power delivery transitions) between the frontside supply rails and backside supply rails so as to provide power taps to the frontside power network from the backside power network.

In some implementations, the frontside power network may be configured to use frontside metal for the frontside supply rails, and also, the backside power network may be configured to use backside buried metal for the backside supply rails, which are disposed underneath the frontside metal of the frontside power network. Also, in some instance, the frontside-to-backside intermixing architecture may be configured to operate as memory power domain architecture that provides the buried transition vias (BTV) 214, which are disposed between the frontside metal of the frontside power network and the backside buried metal of the backside power network.

In various implementations, the power taps 232A, 232B may be configured as buried transition architecture having the backside-to-frontside transition cells with the buried transition vias (BTV) 214 that couple the frontside metal of the frontside power network to the backside buried metal of the backside power network. Thus, the backside-to-frontside transition cells may be used to transition from the backside power network to the frontside power network. Therefore, the power taps 232A, 232B may provide power domain architecture for frontside-to-backside intermixing using buried power rails.

In some implementations, the frontside power network may include one or more frontside metal layers that supply the core voltage in one or more core voltage domains, such as, e.g., the internal core voltage domain (VDDC). Also, the backside power network may include one or more buried metal layers that supply the periphery voltage in one or more periphery voltage domains, such as, e.g., internal periphery voltage domain (VDDP) and the external periphery voltage domain (VDDPE). Also, in various implementations, the power taps 232A, 232B may operate in the external core voltage domain (VDDCE). However, in other implementations, the core voltage domain or the periphery voltage domain may include and/or utilize the external core voltage domain (VDDCE). Also, in some instances, a ground supply may refer to an external ground (VSSE).

In various implementations, the schemes and techniques described herein may provide for a memory power domain architecture for intermixing backside-to-frontside with buried power rails. As described herein, the memory power domain architecture may be configured to use backside buried metal for backside supply rails and use frontside metal for core-array supply rails. Also, the memory power domain architecture may use header-based power-gating circuitry in multiple different voltage domains, such as, e.g., VDDC, VDDCE, VDDP, VDDPE, along with a single ground, such as, e.g., VSSE. Further, the memory power domain architecture may incorporate use of buried power rails with buried transition vias (BTV) and buried metal layers (BMO). The periphery may utilize backside supply rails to improve current-resistance (IR) drop, and the periphery may have frontside metal tracks for signal routings. Also, the frontside core-array may utilize frontside supply rails to avoid an increase in bitcell area, and further, backside-to-frontside transition cells may be utilized for backside-to-frontside coupling transitions.

Figure 3:
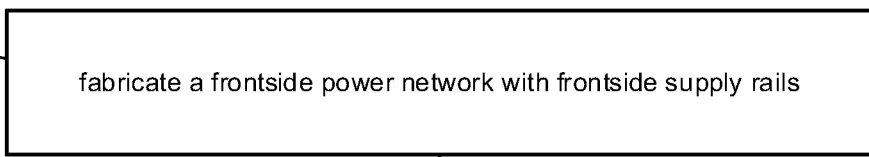
FIG. 3 illustrates a diagram of a method for providing buried power rail (BPR) architecture in accordance with implementations described herein.
Figure 3:
Figure 3:
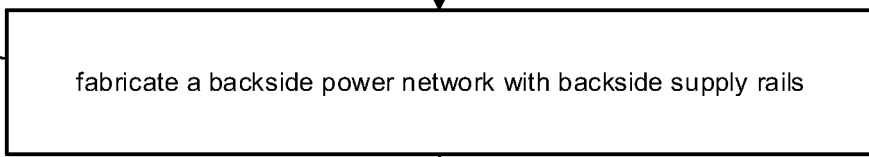
Figure 3:
Figure 3:
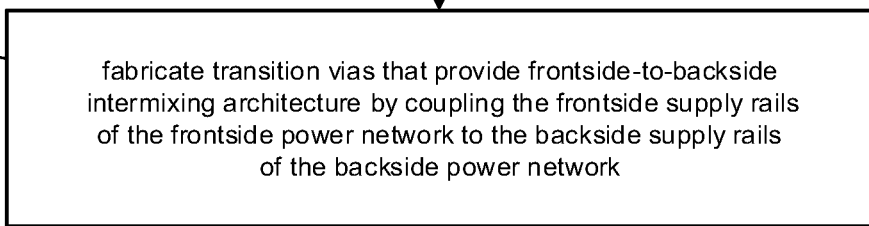

FIG. 3 illustrates a process flow diagram of a method 300 for providing buried power rail (BPR) architecture in accordance with implementations described herein.

It should be understood that even though the method 300 indicates a particular order of operation execution, in some cases, various particular portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2. Also, if implemented in software, the method 300 may be implemented as a program and/or software instruction process configured for providing various frontside-to-backside intermixing schemes and techniques, as described herein. Also, if implemented in software, instructions related to implementing method 300 may be stored in memory and/or a database. For instance, various types of computing devices having a processor and memory may be configured to perform method 300.

In various implementations, the method 300 may refer to a method of designing, providing, fabricating and/or manufacturing frontside-to-backside intermixing architecture as an integrated system, device and/or circuit that may involve use of the various IC circuit components described herein to thereby implement the frontside-to-backside intermixing schemes and techniques associated therewith. In some implementations, the frontside-to-backside intermixing architecture may be integrated with computing circuitry and other related components on a single chip, and the frontside-to-backside intermixing circuitry may be implemented in various embedded systems for automotive, electronic, mobile, server and Internet-of-things (IoT) applications, including remote sensor nodes.

At block 310, method 300 may fabricate a frontside power network with frontside supply rails, and also, at block 320, method 300 may fabricate a backside power network with backside supply rails. The frontside power network may use frontside metal for the frontside supply rails, and the backside power network may use backside buried metal for the backside supply rails, which are disposed underneath the frontside metal of the frontside power network.

At block 330, method 300 may fabricate transition architecture with transition vias that provide frontside-to-backside intermixing architecture by coupling (and/or by providing a coupling transition between) the frontside supply rails of the frontside power network to the backside supply rails of the backside power network. In some instances, the frontside-to-backside intermixing architecture may be configured to provide a power delivery transition (via the coupling transition) between the frontside supply rails of the frontside power network and the backside supply rails of the backside power network so as to thereby provide a power tap from the backside power network to the frontside power network. Also, in some instances, the frontside-to-backside intermixing architecture may be configured to operate as memory power domain architecture that provides the vias as buried transition vias disposed between the frontside metal of the frontside power network and the backside buried metal of the backside power network.

In some implementations, the frontside power network may include one or more frontside metal layers that supply a core voltage in one or more domains, and the one or more domains may include an internal core voltage domain (VDDC). Also, the backside power network may include one or more buried metal layers that supply a periphery voltage in multiple domains, and also, in various implementations, the multiple domains may include an external core voltage domain (VDDCE), an internal periphery voltage domain (VDDP), and an external periphery voltage domain (VDDPE). Also, in various instances, a ground supply may refer to an external ground (VSSE).

Various frontside-to-backside intermixing schemes and techniques described herein provide for various advantageous aspects and features. For instance, the various schemes and techniques described herein provide for frontside-to-backside intermixing architecture that transitions power delivery between the backside power network and the frontside power network in various memory applications. Also, the various schemes and techniques described herein utilize power delivery architecture that operates to provide a backside power delivery network for memory applications. Also, the various schemes and techniques described herein utilize memory power domain architecture that operates for intermixing backside-to-frontside with buried power rails. Accordingly, the memory power domain architecture may be configured to use backside buried metal for backside supply rails and use frontside metal for core-array supply rails.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include frontside power network and a backside power network. The device may include frontside-to-backside intermixing architecture having transition vias that are configured to couple the frontside power network to the backside power network. The frontside power network may include frontside supply rails, and the backside power network may include backside supply rails. The frontside-to-backside intermixing architecture may transition the frontside supply rails of the frontside power network to the backside supply rails of the backside power network so as to thereby provide a power tap to the core circuitry from the backside power network.

Described herein are various implementations of a power delivery architecture. The power delivery architecture may include a frontside power network having frontside supply rails, and the power delivery architecture may include a backside power network having backside supply rails. The power delivery architecture may include frontside-to-backside intermixing architecture having transition vias that provide a coupling transition from the backside supply rails of the backside power network to the frontside supply rails of the frontside power network.

Described herein are various implementations of a method. The method may fabricate a frontside power network with frontside supply rails. The method may fabricate a backside power network with backside supply rails. Also, the method may fabricate transition vias that provide frontside-to-backside intermixing architecture by coupling the frontside supply rails of the frontside power network to the backside supply rails of the backside power network.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
a frontside power network having frontside supply rails that supply core voltage in multiple different domains including multiple core voltage domains that are separate and distinct from ground voltage;
a backside power network having backside supply rails; and
frontside-to-backside intermixing architecture having transition vias that couple the frontside supply rails of the frontside power network to the backside supply rails of the backside power network,
wherein the transition vias are used to provide a direct power tap between the backside supply rails to the frontside supply rails.

2. The device of claim 1, wherein:
the frontside-to-backside intermixing architecture transitions the frontside supply rails of the frontside power network to the backside supply rails of the backside power network using only the transition vias so as to provide the direct power tap to core circuitry from the backside power network.

3. The device of claim 2, wherein:
the frontside-to-backside intermixing architecture is configured to operate as memory power domain architecture that uses backside buried metal of the backside power network for the backside supply rails and uses frontside metal of the frontside power network for the frontside supply rails.

4. The device of claim 3, wherein:
the backside buried metal is disposed underneath the frontside metal, and
only the transition vias are disposed between the backside buried metal and the frontside metal.

5. The device of claim 4, wherein the frontside-to-backside intermixing architecture refers to backside-to-frontside transition cells with the transition vias that couple the frontside metal of the frontside power network to the backside buried metal of the backside power network.

6. The device of claim 1, wherein:
a core array is coupled to the frontside supply rails,
the backside power network supplies one or more periphery voltages and ground,
the transition vias refer to buried transition vias, and
only the buried transition vias are used to provide a direct power tap between the backside supply rails to the frontside supply rails.

7. The device of claim 1, wherein the frontside power network includes frontside metal layers that supply the core voltage in the multiple different domains including the multiple core voltage domains that are separate and distinct from the ground voltage.

8. The device of claim 1, wherein the multiple different domains of the core voltage include an internal core voltage domain (VDDC) and an external core voltage domain (VDDCE).

9. The device of claim 1, wherein the backside power network includes one or more buried metal layers that supply a periphery voltage in multiple domains.

10. The device of claim 9, wherein the multiple domains of the periphery voltage include an external core voltage domain (VDDCE), an internal periphery voltage domain (VDDP), and an external periphery voltage domain (VDDPE).

11. A power delivery architecture, comprising:
a frontside power network having frontside supply rails that supply core voltage in multiple different domains including multiple core voltage domains that are separate and distinct from ground voltage;
a backside power network having backside supply rails; and
frontside-to-backside intermixing architecture having transition vias that provide a coupling transition from the backside supply rails of the backside power network to the frontside supply rails of the frontside power network,
wherein the transition vias are used to provide a direct power tap between the backside supply rails to the frontside supply rails.

12. The architecture of claim 11, wherein the frontside-to-backside intermixing architecture is configured to provide the coupling transition as a power delivery transition between the frontside supply rails and the backside supply rails using only the transition vias so as to provide the direct power tap to the frontside power network from the backside power network.

13. The architecture of claim 11, wherein:
the frontside power network uses frontside metal for the frontside supply rails,
the backside power network uses backside buried metal for the backside supply rails that is disposed underneath the frontside metal of the frontside power network, and the frontside-to-backside intermixing architecture is configured to operate as memory power domain architecture that provides the vias as buried transition vias disposed between the frontside metal of the frontside power network and the backside buried metal of the backside power network.

14. The architecture of claim 11, wherein:

the frontside power network includes frontside metal layers that supply the core voltage in the multiple different domains including the multiple core voltage domains that are separate and distinct from the ground voltage, and the multiple different domains of the core voltage include an internal core voltage domain (VDDC) and an external core voltage domain (VDDCE).

15. The architecture of claim 11, wherein:

the backside power network includes one or more buried metal layers that supply a periphery voltage in multiple domains, and the multiple domains include an external core voltage domain (VDDCE), an internal periphery voltage domain (VDDP), and an external periphery voltage domain (VDDPE).

\* \* \* \* \*